United States Patent
Wang et al.

(10) Patent No.: US 7,432,738 B1
(45) Date of Patent: Oct. 7, 2008

(54) REVERSIBLE SEQUENTIAL APPARATUSES

(75) Inventors: Chun Yao Wang, Hsinchu (TW); Min Lun Chuang, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 16 days.

(21) Appl. No.: 11/692,394

(22) Filed: Mar. 28, 2007

(51) Int. Cl.
H03K 19/173 (2006.01)
(52) U.S. Cl. .......................................... 326/46
(58) Field of Classification Search .................... 326/46
See application file for complete search history.

(56) References Cited

U.S. PATENT DOCUMENTS

| | | | | |
|---|---|---|---|---|
| 5,357,548 | A * | 10/1994 | Merkle | 377/57 |
| 6,987,402 | B2 * | 1/2006 | Lee et al. | 326/104 |
| 2004/0246028 | A1 * | 12/2004 | Lee et al. | 326/104 |
| 2007/0266347 | A1 * | 11/2007 | Chang et al. | 716/3 |

OTHER PUBLICATIONS

Dilip P. Vasudevan, Reversible Logic Design with online testability, Apr. 2006.*
Mayur Bubna, A DFT Methodology for detecting bridging faults in reversible logic circuits, Feb. 2007.*
Pallav Gupta, An algorithm for synthesis of reversible logic circuits, Nov. 2006.*
Min-Lun Chuang and Chun-Yao Wang, Synthesis of reversible sequential elements, Jul. 2007 (not valid for prior art).*
Dmitri Maslov, Toffoli Network Synthesis with templates, Jun. 2005.*
Dmitri Maslov, Fredkin/Toffoli Templates for reversible logic synthesis, Nov. 2003.*
Gerhrd W. Dueck, Transformation based synthesis of networks of Toffoli/Fredkin gates, May 2003.*
Himanshu Thapliyal, Design of reversible sequential elements with feasibility of transistor implementation, Jul. 2007.*
Min-Lun Chuang and Chun-Yao Wang, Synthesis of reversible sequential elements, Jan. 2008 (not valid for prior art).*
Chuang et al., Synthesis of Reversible Sequential Elements, Symposium publication, Jan. 25, 2007, 420-425, National Tsing Hua University, IEEE 12th Asia and South Pacific Design Automation Conference, Taiwan.

* cited by examiner

Primary Examiner—Rexford Barnie
Assistant Examiner—Thienvu V Tran
(74) Attorney, Agent, or Firm—WPAT, P.C.; Anthony King

(57) ABSTRACT

A reversible sequential apparatus comprises a first logic gate and a second logic gate. The first logic gate includes first, second and third input terminals and first, second and third output terminals. The second logic gate includes first and second input lines and first and second output lines. The first input terminal for carrying a clock signal is coupled to the first output terminal and the second input terminal for carrying an input signal is coupled to the second output terminal. When the first input terminal and the second input terminal are simultaneously set to a first state, the level of the third output terminal is inverse to the level of the third input terminal; otherwise, the level of the third output terminal is identical to the level of the third input terminal. The third output terminal, second input line and second output line are coupled to each other. The input signal carried on the first input line is set to a constant level so that the second output line and the first output line have the same outputs.

20 Claims, 8 Drawing Sheets

| x | y | z | x | y | xy⊕z |
|---|---|---|---|---|---|
| 0 | 0 | 0 | 0 | 0 | 0 |
| 0 | 0 | 1 | 0 | 0 | 1 |
| 0 | 1 | 0 | 0 | 1 | 0 |
| 0 | 1 | 1 | 0 | 1 | 1 |
| 1 | 0 | 0 | 1 | 0 | 0 |
| 1 | 0 | 1 | 1 | 0 | 1 |
| 1 | 1 | 0 | 1 | 1 | 1 |
| 1 | 1 | 1 | 1 | 1 | 0 |

| x | y | z | x | y⊕xy⊕xz | z⊕xy⊕xz |
|---|---|---|---|---------|---------|
| 0 | 0 | 0 | 0 | 0 | 0 |
| 0 | 0 | 1 | 0 | 0 | 1 |
| 0 | 1 | 0 | 0 | 1 | 0 |
| 0 | 1 | 1 | 0 | 1 | 1 |
| 1 | 0 | 0 | 1 | 0 | 0 |
| 1 | 0 | 1 | 1 | 1 | 0 |
| 1 | 1 | 0 | 1 | 0 | 1 |
| 1 | 1 | 1 | 1 | 1 | 1 |

| x | y | x | x⊕y |
|---|---|---|---|
| 0 | 0 | 0 | 0 |
| 0 | 1 | 0 | 1 |
| 1 | 0 | 1 | 1 |
| 1 | 1 | 1 | 0 |

| clk | J | K | $Q_n$ | clk' | J' | K' | $Q_{n+1}$ |
|---|---|---|---|---|---|---|---|
| 0 | 0 | 0 | 0 | 0 | 0 | 0 | 0 |
| 0 | 0 | 0 | 1 | 0 | 0 | 0 | 1 |
| 0 | 0 | 1 | 0 | 0 | 0 | 1 | 0 |
| 0 | 0 | 1 | 1 | 0 | 0 | 1 | 1 |
| 0 | 1 | 0 | 0 | 0 | 1 | 0 | 0 |
| 0 | 1 | 0 | 1 | 0 | 1 | 0 | 1 |
| 0 | 1 | 1 | 0 | 0 | 1 | 1 | 0 |
| 0 | 1 | 1 | 1 | 0 | 1 | 1 | 1 |
| 1 | 0 | 0 | 0 | 1 | 0 | 0 | 0 |
| 1 | 0 | 0 | 1 | 1 | 0 | 0 | 1 |
| 1 | 0 | 1 | 0 | 1 | 0 | 1 | 0 |
| 1 | 0 | 1 | 1 | 1 | 1 | 1 | 0 |
| 1 | 1 | 0 | 0 | 1 | 1 | 0 | 1 |
| 1 | 1 | 0 | 1 | 1 | 0 | 1 | 1 |
| 1 | 1 | 1 | 0 | 1 | 1 | 1 | 0 |
| 1 | 1 | 1 | 1 | 1 | 1 | 0 | 0 |

FIG. 5

REVERSIBLE SEQUENTIAL APPARATUSES

BACKGROUND OF THE INVENTION

1. Field of the Invention

The present invention relates to reversible sequential apparatuses, and more particularly to a reversible sequential apparatus configured by reversible gates.

2. Description of the Related Art

Reversible computing eliminates information loss during the computation process. Thus, it naturally minimizes heat generation due to information loss. Zero energy dissipation is possible only if all gates in a network are reversible. As a result, reversibility will become an essential property in future circuit design. Reversible logic has been applied to various future technologies, such as ultra-low-power CMOS design, optical computing, quantum computing and nanotechnology. These technologies increasingly employ reversible logic gates to reduce power consumption.

However, conventional logic gates are generally irreversible. Among the most commonly used gates, only the NOT gate is reversible. The AND gate and the OR gate are irreversible because they cannot satisfy the condition of one-to-one and mapping between the inputs and outputs of a logic gate. One way to make the AND function reversible is to add one input and two outputs, as shown in FIG. 1(a). These additional input and outputs for reversibility are called garbage bits. The AND function can be obtained in the third output column xy□F (□ representing an XOR gate) of FIG. 1(a), when setting z=0. The truth table of AND function is shown in bold.

This whole truth table is equivalent to the truth table of the 3-bit Toffoli gate, and its symbol is shown in FIG. 1(b). The third output column xy□z means that the output is $\bar{z}$ when x=y=1, and otherwise the output is z. This gate can be used to realize a 2-input reversible AND function by setting z as a constant 0, as mentioned.

Fredkin gate is a reversible gate as well and is also called controlled SWAP gate. FIG. 2(a) is the symbol of Fredkin gate and FIG. 2(b) is its truth table. Its behavior can be described as follows: if the control bit x is set to 1, the outputs of y and z are swapped; otherwise they remain unchanged.

A restriction on reversible logic synthesis has to be followed: the fanout count of a signal net must equal one so that a duplication is necessary if two copies of one signal are needed. This restriction is due to the fact that the fanout structure itself is not reversible. For fanout, the number of input signals is one, but there are two or more output signals. Therefore, for this restriction, a 2-bit Toffoli gate is utilized to duplicate a signal. The symbol of a 2-bit Toffoli gate and its truth table are shown in FIGS. 3(a) and 3(b), respectively. The function of the second output column is x□y. If y is set as a constant 0, a copy of input variable x will be obtained in the second output, which is shown in bold. Therefore, the fanout structure in a conventional network can be implemented in this way.

There are two objectives in reversible circuit synthesis:
1. Minimize the number of gates: the number of gates gives a simple estimation of the implementation cost of a reversible circuit.
2. Minimize the number of garbage outputs: we need extra implementation cost (area and power) for those garbage outputs in reversible circuits. Minimizing the number of garbage outputs leads to minimizing the chip area and power consumption of a reversible circuit.

However, the synthesis result of a traditional D latch is not good when the conventional direct transformation method is used to implement a reversible D latch. This is because the D latch is built by many irreversible gates; using the direct transformation method to construct a reversible D latch will require a large number of gates and garbage outputs.

SUMMARY OF THE INVENTION

An objective of the present invention is to provide a reversible sequential apparatus built by a minimum number of gates. The implementation cost of the reversible sequential apparatuses is substantially reduced.

In order to achieve the objective, the present invention discloses a reversible sequential apparatus comprising a first logic gate and a second logic gate. The first logic gate includes a first input terminal, a second input terminal, a third input terminal, a first output terminal, a second output terminal and a third output terminal. The second logic gate includes a first input line, a second input line, a first output line and a second output line. The terminals are used to designate the inputs and outputs of the first logic gate and the lines are used to designate the inputs and outputs of the second logic gate. The first input terminal for carrying a clock signal is coupled to the first output terminal and the second input terminal for carrying an input signal is coupled to the second output terminal. When the first input terminal and the second input terminal are simultaneously set to a first state, the level of the third output terminal is inverse to the level of the third input terminal; otherwise, the level of the third output terminal is identical to the level of the third input terminal. The third output terminal, second input line and second output line are coupled to each other. The input signal carried on the first input line is set to a constant level so that the second output line and the first output line have the same outputs. Furthermore, the first output line is fed back to the third input terminal.

The present invention further discloses a reversible sequential apparatus comprising a first logic gate, a second logic gate, a third logic gate and a fourth logic gate. The fourth logic gate includes a first input line, a second input line, a first output line and a second output line. The first logic gate includes first, second and third input lines and first, second, and third output lines. Each of the second logic gate and third logic gate includes first, second, third and fourth input lines and first, second, third and fourth output lines. The fourth input line and fourth output line of the third logic gate, the fourth input line and fourth output line of the second logic gate, the third input line and third output line of the first logic gate and the second input line and second output line of the fourth logic gate are connected in series. The third input line and third output line of the third logic gate and the third input line and third output line of the second logic gate are connected in series. The second input line and second output line of the third logic gate, the second input line and second output line of the second logic gate and the second input line and second output line of the first logic gate are connected in series. The first input line and first output line of the third logic gate, the first input line and first output line of the second logic gate and the first input line and first output line of the first logic gate are connected in series. When the first, second and fourth input lines of the third logic gate are simultaneously set to 1 as a first level, the levels of the third input line and the third output line of the third logic gate are opposite to each other. When the first, third and fourth input lines of the second logic gate are simultaneously set to the first level, the levels of the second input line and the second output line of the second logic gate are opposite to each other. When the first and second input lines of the first logic gate are simultaneously set to the first level, the levels of the third input line and the third output line of the first logic gate are opposite to each other. The input signal carried on the first input line of the fourth logic gate is set to a constant level so that the second output line and the first output line of the fourth logic gate have the same outputs. Furthermore, the first output line of the fourth logic gate is fed back to the fourth input line of the third logic gate.

BRIEF DESCRIPTION OF THE DRAWINGS

The invention will be described according to the appended drawings in which:

FIG. 5 is the augmented truth table of a JK latch in accordance with the present invention.

PREFERRED EMBODIMENT OF THE PRESENT INVENTION

Figures 1A, 1B:
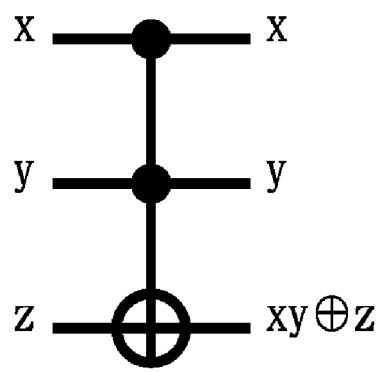
FIG. 1(a) is the truth table of a 3-bit Toffoli gate.
FIG. 1(b) is the symbol of a 3-bit Toffoli gate.
Figures 2A, 2B:
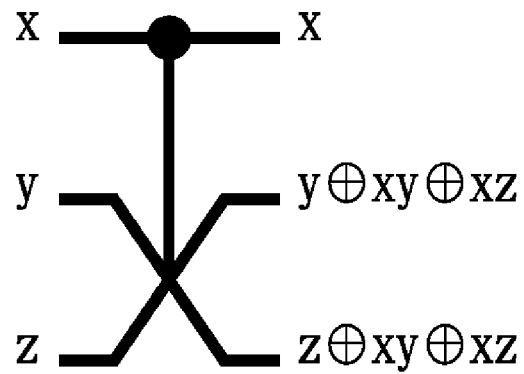
FIG. 2(a) is the symbol of a Fredkin gate.
FIG. 2(b) is the truth table of a Fredkin gate.
Figures 3A, 3B:
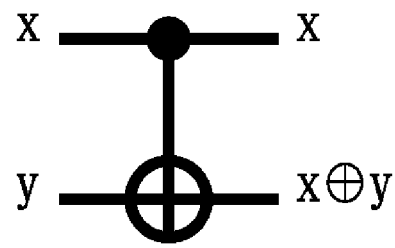
FIG. 3(a) is the symbol of a 2-bit Toffoli gate.
FIG. 3(b) is the truth table of a 2-bit Toffoli gate.
Figures 4A, 4B, 4C:
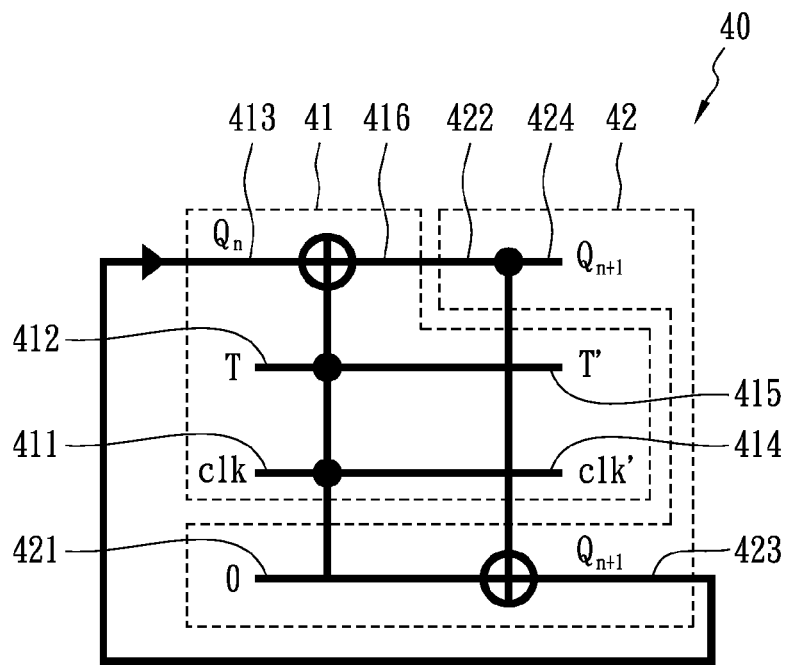
FIG. 4(a) is the augmented truth table of a T latch in accordance with the present invention.
FIG. 4(b) is the configuration of a T latch in accordance with the present invention.
FIG. 4(c) shows the functional verification of the T latch in accordance with the present invention.

FIG. 4(a) is the augmented truth table of a T latch in accordance with the present invention. Regarding the present embodiment, a truth table extension method is used to construct the novel design of the T latch. Unlike the direct transformation method, the irreversible gates are not directly replaced with the reversible ones within a sequential apparatus. Instead, the original irreversible truth table of a sequential T latch is extended to an augmented reversible one. The first output clk' and second output T' are two garbage outputs that make the original T latch reversible, as shown in FIG. 4(a). The minimum number of garbage outputs required for reversibility is $\lceil \log(q) \rceil$, where q is the maximum number of times an output pattern is repeated in the truth table. In this embodiment, 0 and 1 are repeated four times in the output column $Q_{n+1}$ so that $\lceil \log(4) \rceil$ is equal to 2. Accordingly, the additional outputs clk' and T' make the table reversible. Compared with the truth table in FIG. 1(a), the augmented truth table is identical. This means only one 3-bit Toffoli gate is needed to implement a reversible T latch. The values of the present truth table are assigned in different ways, so the design may be different.

After synthesizing this augmented reversible function, the fanout problem is incurred and should be resolved. The input Q in the next state comes from the current output $Q_{n+1}$. Thus, an additional $Q_{n+1}$ is needed for feedback. Accordingly, a 2-bit Toffoli gate is used to duplicate the output variable $Q_{n+1}$. The complete implementation of the reversible T latch 40 is shown in FIG. 4(b).

The reversible T latch 40 comprises a 3-bit Toffoli gate 41 and a 2-bit Toffoli gate 42. The 3-bit Toffoli gate 41 includes a first input terminal clk 411 for carrying a clock signal, a second input terminal T 412 for carrying a data input signal, a third input terminal $Q_n$ 413 for carrying another data input signal, a first output terminal clk' 414, a second output terminal T' 415 and a third output terminal 416. The 2-bit Toffoli gate 42 includes a first input line 421, a second input line 422, a first output line $Q_{n+1}$ 423 and a second output line $Q_{n+1}$ 424. The terminals are used to designate the inputs and outputs of the 3-bit Toffoli gate 41 and the lines used to designate the inputs and outputs of the 2-bit Toffoli gate 42. The first input terminal clk 411 is coupled to the first output terminal clk' 414. When the first input terminal clk 411 and the second input terminal T 412 are simultaneously set to a first state such as 1, the level of the third output terminal 416 is inverse to the level of the third input terminal 413 $Q_n$; otherwise, the level of the third output terminal 416 is identical to the level of the third input terminal 413 $Q_n$ when the first input terminal 411 and the second input terminal 412 are simultaneously set to a second state such as 0. The third output terminal $Q_{n+1}$ 416, second input line 422 and second output line $Q_{n+1}$ 424 are coupled to each other. The input signal carried on the first input line 421 is set to 0 so that the second output line $Q_{n+1}$ 424 and the first output line $Q_{n+1}$ 423 have the same output $Q_{n+1}$. In this embodiment, the input signal carried on the first input line 421 is set to 0 as a constant level. If an inverter or an equivalent circuit is added to the first input line 421, the input signal would be set to 1 as a constant level. Furthermore, the first output line $Q_{n+1}$ 423 is fed back to the third input terminal $Q_n$ 413.

Whether the design of the reversible T latch 40 exactly exhibits the behavior of a T latch is to be verified. The leftmost part of the symbol in FIG. 4(c) shows the Boolean functions obtained from the augmented truth table of T latch in FIG. 4(a). To simplify the expression of Boolean equations, the symbol "C" is used to represent input variable clk. The rightmost part of the symbol in FIG. 4(c) shows the functions of implemented reversible T latch. These two expressions are identical, and therefore the functionality of the reversible T latch is correct.

Unlike the T latch 40, because the function of a JK latch is quite complex, it is not easy to model the function by using a single reversible gate. Therefore, a transformation based synthesis algorithm is used to construct the reversible JK latch. First, the augmented reversible truth table is derived, as shown in FIG. 5. Then, the transformation based synthesis algorithm is applied to implement the reversible function. The philosophy of the transformation-based algorithm is to cascade some reversible gates such that the output of the truth table is equal to the input. Construction of the reversible JK latch is described in detail in the following corresponding paragraphs.

The augmented truth table in the lexicographical order is inspected until the first output assignment differs from the input assignment. The first output assignment which is not equal to input assignment in the table in FIG. 5 is 1110.

Then, some generalized Toffoli gates are added from the end of the constructed circuit towards its beginning to make the output assignments equal some input assignments. There are two rules when a generalized Toffoli gate is chosen:

1. Deal with those bits that should become to 1 first: the output assignment is expected to change from 1110 to 1011. Hence the $2^{nd}$ bit should be changed from 1 to 0 and the $4^{th}$ bit should be changed from 0 to 1. Therefore, the $4^{th}$ bit is dealt with first.
2. Retain the output assignments which are prior to the current intact one: the output assignments prior to 1110 are identical to their corresponding input assignments, so they are kept unchanged. Using TOF(clk', J', K'; $Q_{n+1}$) or TOF(clk', J'; $Q_{n+1}$) is effective to invert the 4$^{th}$ bit of 1110 and leave the output assignments prior to it unchanged. Here, TOF (C; T) is used to represent a Toffoli gate, where C is a set of control variables {clk', J', K'} and T is a target variable {$Q_{n+1}$} A TOF(clk', J'; $Q_{n+1}$) is added to the end of the constructed circuit in this iteration. It is worth noting that this process might change other output assignments after 1110, such as 1101 or 1111. Nevertheless, they can be reformed in the same way in later iterations.

Figures 6A, 6B:
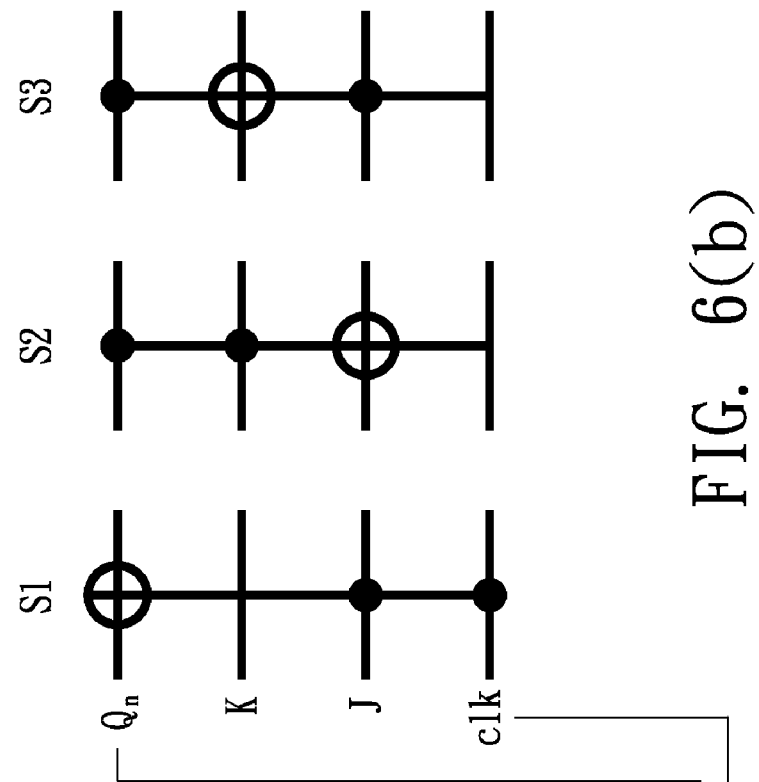
FIGS. 6(a)-6(b) show the process of synthesizing this reversible JK latch.
Figure 7:
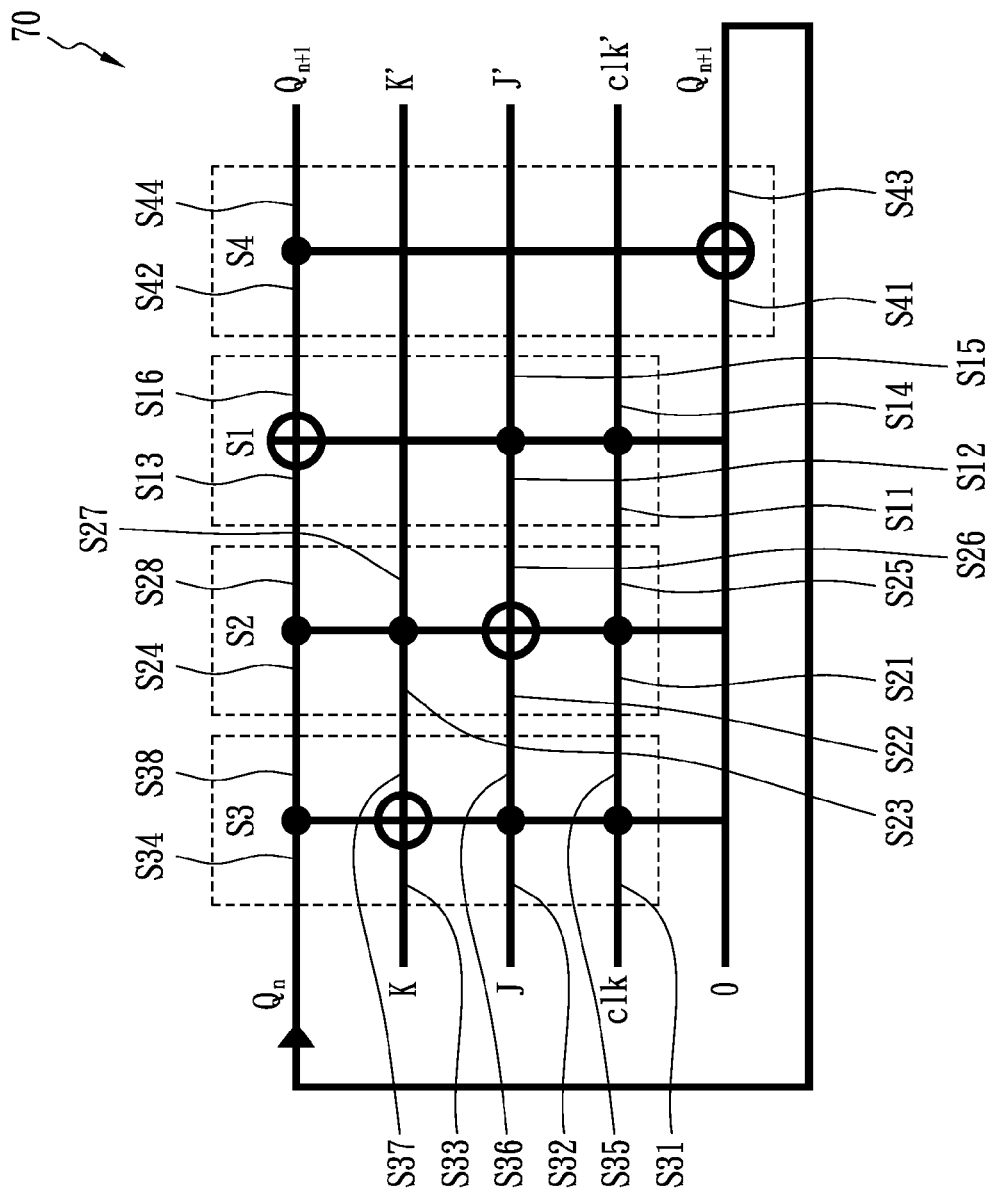
FIG. 7 is the configuration of a JK latch in accordance with the present invention.
Figure 8:
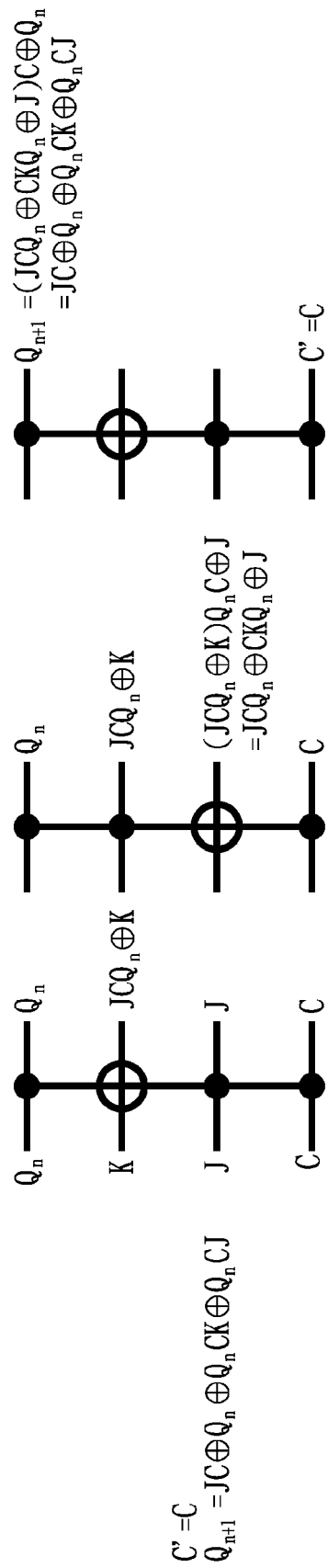
FIG. 8 shows the functional verification of the JK latch in accordance with the present invention.

In each step, an appropriate generalized Toffoli gate is used to synthesize the reversible function according to these two rules. The algorithm is terminated when all of the output assignments are equal to the input assignments. FIGS. 6(a)-6(b) show the process of synthesizing this reversible JK latch. After adding a generalized Toffoli gate in each step, those with changed output assignments are in bold. It is also worth noting that the gates are identified sequentially from the output side to the input side. The final structure of a reversible JK latch is shown in FIG. 7. The verification of the reversible JK latch is shown in FIG. 8.

As shown in FIG. 7, the JK latch 70, a reversible sequential apparatus, comprises a 3-bit Toffoli gate S1, a 4-bit Toffoli gate S2, a 4-bit Toffoli gate S3 and a 2-bit Toffoli gate S4. The 2-bit Toffoli gate S4 includes a first input line S41, a second input line S42, a first output line S43 and a second output line S44. The 3-bit Toffoli gate S1 includes first, second and third input lines S11-S13 and first, second, and third output lines S14-S16. The 4-bit Toffoli gate S2 includes first, second, third and fourth input lines S21-S24 and first, second, third and fourth output lines S25-S28. The 4-bit Toffoli gate S3 includes first, second, third and fourth input lines S31-S34 and first, second, third and fourth output lines S35-S38. The fourth input line S34 $Q_n$ and fourth output line S38 of the 4-bit Toffoli gate S3, the fourth input line S24 and fourth output line S28 of the 4-bit Toffoli gate S2, the third input line S13 and third output line S16 of the 3-bit Toffoli gate S1 and the second input line S42 and second output line S44 $Q_{n+1}$ of the 2-bit Toffoli gate S4 are connected in series. The third input line K S33 and third output line S36 of the 4-bit Toffoli gate S3 and the third input line S23 and third output line K' S27 of the 4-bit Toffoli gate S2 are connected in series. The second input line J S32 and second output line S36 of the 4-bit Toffoli gate S3, the second input line S22 and second output line S26 of the 4-bit Toffoli gate S2 and the second input line S12 and second output line J' S15 of the 3-bit Toffoli gate S1 are connected in series. The first input line clk S31 and first output line S35 of the 4-bit Toffoli gate S3, the first input line S21 and first output line S25 of the 4-bit Toffoli gate S2 and the first input line S11 and first output line clk' S14 of the 3-bit Toffoli gate S1 are connected in series. When the first, second and fourth input lines S31, S32, S34 of the 4-bit Toffoli gate S3 are simultaneously set to 1 as a first level, the levels of the third input line K S33 and of the third output line S37 of the 4-bit Toffoli gate S3 are opposite to each other. When the first, third and fourth input lines S21, S23, S24 of the second logic gate are simultaneously set to the first level, the levels of the second input line S23 and the second output line S26 of the 4-bit Toffoli gate S2 are opposite to each other. When the first and second input lines S11, S12 of the 3-bit Toffoli gate S1 are simultaneously set to the first level, the levels of the third input line S13 and the third output line S16 of the 3-bit Toffoli gate S1 are opposite to each other.

The aforementioned descriptions of the present invention are intended to be illustrative only. Numerous alternative methods may be devised by persons skilled in the art without departing from the scope of the following claims.

What is claimed is:

1. A reversible sequential apparatus, comprising:
a first logic gate including a first input terminal, a second input terminal, a third input terminal, a first output terminal coupled to the first input terminal, a second output terminal coupled to the second input terminal and a third output terminal, wherein the logic levels of the third output terminal and the third input terminal are opposite to each other when the first input terminal and the second input terminal are simultaneously set to a first state; and
a second logic gate including a first input line, a second input line, a first output line, a second output line, wherein the second output line is coupled to the third output terminal and the second input line, wherein the input of the first input line is set as a constant level to force outputs of the second output line and the first output line being identical.

2. The reversible sequential apparatus of claim 1, wherein the output of the first output line is fed back to the third input terminal.

3. The reversible sequential apparatus of claim 1, wherein the first logic gate is a 3-bit Toffoli gate.

4. The reversible sequential apparatus of claim 1, wherein the second logic gate is a 2-bit Toffoli gate.

5. The reversible sequential apparatus of claim 1, wherein the logic levels of the third output terminal and the third input terminal are opposite to each other when the first input terminal and the second input terminal are simultaneously set to logic 1.

6. The reversible sequential apparatus of claim 1, wherein the logic levels of the third output terminal and the third input terminal are the same when the first input terminal and the second input terminal are simultaneously set to logic 0.

7. The reversible sequential apparatus of claim 1, wherein the first input terminal carries a clock signal, the second input terminal carries a data input signal and the third input terminal carries a data input signal.

8. The reversible sequential apparatus of claim 1, which acts as a reversible T latch.

9. A reversible sequential apparatus, comprising:
a first logic gate including first, second and third input lines and first, second, and third output lines, wherein the levels of the third input line and the third output line of the first logic gate are opposite to each other when the first and second input lines of the first logic gate are set to a first state;
a second logic gate including first, second, third and fourth input lines and first, second, third and fourth output lines, wherein the levels of the second input line and the second output line of the second logic gate are opposite to each other when the first, third and fourth input lines of the second logic gate are set to the first state;
a third logic gate including first, second, third and fourth input lines and first, second, third and fourth output lines, wherein the levels of the third input line and the third output line of the third logic gate are opposite to each other when the first, second and fourth input lines of the third logic gate are set to the first state; and
a fourth logic gate including a first input line, a second input line, a first output line and a second output line, wherein the input of the first input line is set to a constant level to force outputs of the second output line and the first output line being identical;
wherein the fourth input line and fourth output line of the third logic gate, the fourth input line and fourth output line of the second logic gate, the third input line and third output line of the first logic gate and the second input line and second output line of the fourth logic gate are connected in series;

wherein the third input line and third output line of the third logic gate and the third input line and third output line of the second logic gate are connected in series;

wherein the second input line and second output line of the third logic gate, the second input line and second output line of the second logic gate and the second input line and second output line of the first logic gate are connected in series;

wherein the first input line and first output line of the third logic gate, the first input line and first output line of the second logic gate and the first input line and first output line of the first logic gate are connected in series.

10. The reversible sequential apparatus of claim 9, wherein the first logic gate is a 3-bit Toffoli gate.

11. The reversible sequential apparatus of claim 9, wherein each of the second logic gate and the third logic gate is a 4-bit Toffoli gate.

12. The reversible sequential apparatus of claim 9, wherein the fourth logic gate is a 2-bit logic gate.

13. The reversible sequential apparatus of claim 9, wherein the first output line of the fourth logic gate is fed back to the fourth input line of the third logic gate.

14. The reversible sequential apparatus of claim 9, wherein the first input line of the third logic gate carries a clock signal, and each of the second input line, the third input line and the fourth input line of the second logic line carries a data input signal.

15. The reversible sequential apparatus of claim 9, which acts as a JK latch.

16. The reversible sequential apparatus of claim 9, wherein the first state is logic 1.

17. The reversible sequential apparatus of claim 9, wherein the constant level is logic 0.

18. The reversible sequential apparatus of claim 9, wherein the levels of the third input line and the third output line of the first logic gate are identical to each other when one of the first and second input lines of the first logic gate is set to a second state.

19. The reversible sequential apparatus of claim 9, wherein the levels of the third input line and the third output line of the third logic gate are identical to each other when at least one of the first, second and fourth input lines of the third logic gate is set to a second state.

20. The reversible sequential apparatus of claim 9, wherein the levels of the third input line and the third output line of the third logic gate are identical to each other when at least one of the first, second and fourth input lines of the third logic gate is set to a second state.

* * * * *